US006005257A

United States Patent [19]

Estrera et al.

[11] Patent Number: 6,005,257

[45] Date of Patent: *Dec. 21, 1999

[54] TRANSMISSION MODE PHOTOCATHODE WITH MULTILAYER ACTIVE LAYER FOR NIGHT VISION AND METHOD

[75] Inventors: Joseph P. Estrera, Dallas; Keith T. Passmore, Rowlett; Timothy W. Sinor, Plano, all of Tex.

[73] Assignee: Litton Systems, Inc., Beverly Hills, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/527,688

[22] Filed: Sep. 13, 1995

[51] Int. Cl.[6] .......................... H01L 3/0304; H01J 40/06; H01J 31/26

[52] U.S. Cl. ............................ 257/11; 257/185; 257/191; 313/368; 313/542; 313/501

[58] Field of Search ................................. 257/11, 10, 21, 257/191, 185, 440; 313/368, 542, 501

[56] References Cited

U.S. PATENT DOCUMENTS

| | | | |
|---|---|---|---|
| 3,696,262 | 10/1972 | Antypas | 257/10 |
| 3,814,996 | 6/1974 | Enstrom | 257/11 |
| 3,868,523 | 2/1975 | Klopfer | 313/373 |
| 4,616,248 | 10/1986 | Khan | 257/11 |
| 4,829,355 | 5/1989 | Munier | 257/11 |
| 5,146,296 | 9/1992 | Huth | 313/373 |
| 5,404,026 | 4/1995 | Mariella | 257/11 |
| 5,506,402 | 4/1996 | Estrera | 313/373 |
| 5,747,862 | 5/1998 | Kishino | 257/11 |

*Primary Examiner*—Jerome Jackson, Jr.
*Attorney, Agent, or Firm*—Baker & Botts, L.L.P.

[57] ABSTRACT

An improved photocathode and image intensifier tube are disclosed along with a method for making both the tube and photocathode. The disclosed photocathode and image intensifier tube have an active layer comprising two or more sublayers. The first sublayer has a first concentration of a group III–V semiconductor compound while the second sublayer has a second concentration of the group III–V semiconductor compound. The multilayer active layer is coupled to a window layer.

20 Claims, 2 Drawing Sheets

TRANSMISSION MODE PHOTOCATHODE WITH MULTILAYER ACTIVE LAYER FOR NIGHT VISION AND METHOD

TECHNICAL FIELD OF THE INVENTION

This invention relates generally to night vision systems, and more particularly, to an improved photocathode and image intensifier tube and a method for making the same.

BACKGROUND OF THE INVENTION

Detection and imaging out to the near infrared (wavelengths greater than 940 nm) have been a weak point of standard image intensifier and night vision systems. Standard night vision systems using Gen II (S-20, S-25) and Gen III (GaAs NEA) based photocathodes have little or no photosensitivity beyond wavelengths of 940 nm. However, sensitivity beyond those wavelengths is desirable. Night sky radiation begins to increase dramatically beyond 950 nm wavelength and most existing detectors and imagers cannot observe this increased night sky irradiance. More importantly, most standard photocathode systems cannot detect or utilize the active imaging capability of near infrared based lasers such as the Nd:YAG laser with 1.064 μm monochromatic radiation.

Recently, non-field assisted transmission mode photocathodes capable of imaging Nd:YAG laser radiation have been developed by Varo, Inc. These devices take advantage of an active layer of indium-gallium-arsenide coupled with an aluminum-gallium-arsenide window layer. Although these devices have sensitivity to near infrared wavelengths, increased sensitivity would be desirable for some applications.

Moreover, it would be desirable to have a photocathode with photosensitivity in the near infrared range of 1 to 1.7 μm. In particular, certain designators and laser rangefinders used in military applications employ erbium-doped glass lasers which produce radiation with a wavelength of between 1.4 and 1.5 μm. Existing image intensifiers and night vision systems are not capable of detecting radiation with wavelengths in this range.

In photocathodes with an indium-galium-arsenide active layer, detecting longer wavelengths requires the indium-gallium-arsenide active layer to have a high percentage of indium. For example, it is believed that a photocathode capable of detecting radiation from an erbium-doped glass laser would require an indium percentage in the active layer between forty and sixty percent. As the percentage of indium increases, however, crystal stress increases due to variations between the lattice constant of the active layer and the lattice constant of the window layer.

When the indium concentration reaches such a high level, degradation in crystal quality is significant. Increased crystal stress due to the mismatch of the lattice constants between the window and active layers causes both light scatter and electron scatter. Irregularities in the lattice due to crystal stress cause light scatter. In an irregular lattice, photons are not absorbed properly, but instead are reflected and scattered within the crystal. Lattice irregularities also prevent electrons from easily escaping the lattice and instead tend to cause electrons to scatter. These effects combine to sufficiently lower the quantum efficiency of such a device so as to make it unacceptable for a standard image intensifier in a night vision system.

SUMMARY OF THE INVENTION

The present invention avoids the limitations of existing photocathodes and image intensifier tubes by using an improved photocathode having an active layer with multiple sublayers. An improved image intensifier tube and photocathode are disclosed along with a method for making both. One aspect of the invention is an improved photocathode having a window layer adjacent to an active layer. The active layer comprises two or more sublayers where at least one sublayer has a first concentration of a group III–V semiconductor compound and another sublayer has a second concentration of the group III–V semiconductor compound.

The invention has many important technical advantages. One advantage is that the photocathode has a higher quantum efficiency than many existing photocathodes. By controlling the concentration of a particular group III–V semiconductor compound in each sublayer such that the energy band of each sublayer decreases as the sublayers get farther away from the window layer, a cascade effect is created. By placing the sublayer with the highest energy adjacent to the window layer and then decreasing the energy of each succeeding sublayer, it is believed that a cascade effect is created such that the movement of electrons from high energy bands to low energy bands causes additional electrons to be generated in succeeding sublayers, thus increasing the total number of electrons generated by the active layer in response to radiation. This effect also allows the photocathode to be sensitive to both visible and near infrared radiation without the complications of high energy electrons trying to travel through bulk low energy based material which has short diffusion lengths.

The multilayer structure of the active layer substantially reduces crystal stress and allows at least a portion of the active layer to have a higher percentage group III–V semiconductor compound which would be unattainable in a single layer device. For example, by gradually increasing the percentage of indium in sublayers moving away from the window layer, a higher indium concentration can be achieved without causing crystal stress. The higher indium concentration in outer sublayers allows the invention to achieve higher sensitivity to near-infrared radiation in a device with good quantum efficiency.

For example, the invention can be used to achieve sensitivity in a photocathode and image intensifier to near infrared radiation in the 1.4–1.5 μm range. Such sensitivity is advantageous for use of night vision equipment with military designators and laser rangefinders employing erbium-doped glass lasers. By carefully varying the concentration of a group III–V semiconductor compound in various sublayers, and/or varying the thickness of various sublayers, one can tune a photocathode to have narrow band spectral sensitivity. These advantages are all achieved without sacrificing compatibility with existing Gen III image intensifier format. Gen III manufacturing processes can be used to produce the photocathode and image intensifiers. The resulting photocathode is also advantageous in that it is a transmission mode device that is non-field assisted.

Applications of the invention include night vision systems, military systems, CCD camera technology, gated imaging technology, and scientific applications involving the detection of near-infrared radiation.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE INVENTION

The preferred embodiment of the present invention and its advantages are best understood by referring to FIGS. 1 through 4 of the drawings, like numerals being used for like and corresponding parts of the various drawings.

Figure 1:
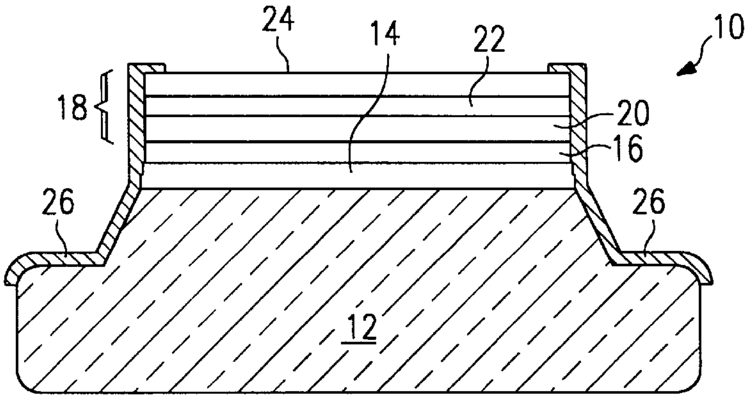
FIG. 1 illustrates a photocathode made in accordance with the invention.

FIG. 1 illustrates a cross-sectional side view of one example of a photocathode 10 constructed in accordance with the teachings of the present invention. Photocathode 10 comprises face plate 12, anti-reflection coating 14, window layer 16, active layer 18, and electrode 26. Active layer 18 further comprises first sublayer 20, second sublayer 22 and third sublayer 24.

Face plate 12 is made of glass and is bonded to anti-reflection coating 14. Anti-reflection coating 14 comprises a first layer of silicon nitride which serves as an anti-reflection coating and a second layer of silicon dioxide which provides thermal protection and a bonding layer for coupling window layer 16 to face plate 12 during the thermal bonding process described below in connection with FIG. 2. The thickness of the silicon nitride and silicon dioxide layers is approximately 1000 angstroms each.

Anti-reflection coating 14 connects to window layer 16. Window layer 16 preferably comprises one or more group III–V semiconductor compounds. In this example, window layer 16 comprises aluminum-gallium-arsenide (AlGaAs). Window layer 16 serves as a short-wavelength cutoff filter for incoming light into photocathode 10, a barrier and reflector for electrons trying to go in the direction of the interface between window layer 16 and active layer 18, and a supporting and thermal protective layer for active layer 18. Window layer 16 has a thickness of approximately 0.8–1.0 $\mu$m and has a p-type doping level of $1\text{–}3\times10^{18}$ $cm^{-3}$. The aluminum composition and thickness of window layer 16 may be adjusted to obtain the desired amount of short wavelength radiation through that layer.

Active layer 18 comprises three sublayers which are each 0.5–1.0 $\mu$m thick. Active layer 18 comprises one or more group III–V semiconductor compounds. In this example, active layer 18 comprises indium gallium arsenide (InGaAs). The indium concentration of each sublayer increases beginning at first sublayer 20 and ending at third sublayer 24. Given a formula of $In_xGa_{1-x}As$, the percent concentration of indium in a given layer is governed by the formula 100 * x. In this example, first sublayer 20 has a five percent indium concentration, second sublayer 22 has a ten percent indium concentration and third sublayer 24 has a, fifteen percent indium concentration. Thus, the indium concentration is graded such that the concentration increases as the sublayers get farther away front window layer 16.

Electrode 26 is coupled to face plate 12, anti-reflection coating 14, window layer 16 and active layer 18. Electrode 26 is a chrome gold electrode.

In operation, photons enter photocathode 10 through face plate 12 and pass through anti-reflection coating 14 and window layer 16. As the photons strike active layer 18, electrons are generated and emitted from the surface of active layer 18.

The sublayer structure of active layer 18 can be arranged in a way so as to filter various wavelengths. Layers with low indium concentrations such as sublayer 20 absorb photons with short wavelengths and generate electrons in response to such absorption. Photons with longer wavelengths pass through sublayers such as first sublayer 20 with low indium concentration. At second sublayer 22, photons with slightly longer wavelengths are absorbed and generate electrons, while even longer wavelengths pass through to third sublayer 24. Third sublayer 24 generates electrons in response to photons having even longer wavelengths.

The compositional grading of active layer 18 reduces crystal stress between window layer 16 and active layer 18. Reducing crystal stress allows near infrared sensitivity to be increased with high quantum efficiency. The reduction in crystal stress allows more photogenerated electrons to travel through an undamaged crystal lattice of the photocathode. These benefits can be achieved because the sublayers nearest to window layer 16 have a lower indium concentration and therefore have a lattice constant closer to that of window layer 16. By gradually increasing indium concentration, lattice mismatch effects between window layer 16 and active layer 18 are drastically reduced. By raising the concentration of indium in the outer sublayers, better sensitivity to near-infrared radiation can be achieved.

Compositional grading also allows formation of an electronic band structure in photocathode 10 which causes photogenerated electrons to cascade from high to low energy conduction subbands. Sublayers with lower indium concentration have higher energy. In this example, first sublayer 20 has higher energy than second sublayer 22 and second sublayer 22 has higher energy than third sublayer 24. This compositional grading causes photogenerated electrons to cascade down their respective higher energy conduction subbands to lower energy conduction subbands in sublayers with higher indium concentration. The overall effect of the multilayer construction of active layer 18 is to easily transport electrons generated by high energy radiation (visible light) to lower energy based material (high indium concentration layers) for escape to the surface of photocathode 10. Compositional grading thus allows photocathode 10 to have the ability to be sensitive to both visible and near infrared radiation without the complication of high energy electrons trying to travel through bulk low energy (high indium concentration) InGaAs which has short diffusion lengths (less than 1.0 82 m).

Selectively arranging the thicknesses of the sublayers of active layer 18 along with selective doping allows photocathode 10 to be made to have narrow band spectral sensitivities. This feature is attractive for laser imaging applications.

Figure 2:
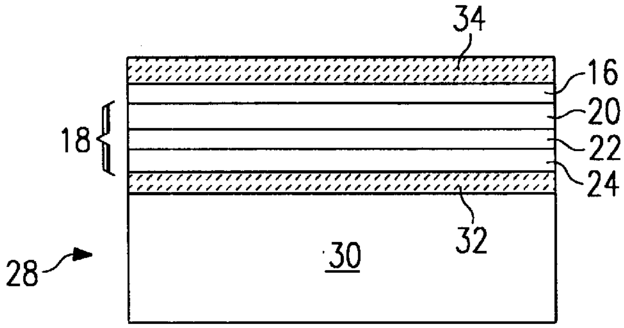
FIG. 2 illustrates a wafer structure used to produce the photocathode of FIG. 1.

The method of making photocathode 10 can best be understood by referring to FIG. 2 in conjunction with FIG. 1. FIG. 2 illustrates a cross-sectional side view of a multilayer wafer 28 used in making photocathode 10. Wafer 28 comprises substrate 30, stop layer 32, active layer 18, window layer 16, and cap layer 34. Active layer 18 further comprises first sublayer 20, second sublayer 22, and third sublayer 24. Photocathode 10 is preferably fabricated using steps similar to those used in standard Gen III processes.

Wafer 28 is an epitaxially grown wafer structure. It may be formed, for example, using processes such as metal organic chemical vapor deposition (MOCVD), molecular beam epitaxy (MBE) or metal organic molecular beam epitaxy (MOMBE). The fabrication process for the illustrated embodiment begins by using a commercially available single crystal gallium arsenide substrate 30 with a low defect density. Substrate 30 will be the foundation and support for the epitaxial growth of subsequent layers. Another type of substrate 30 could also be used.

Stop layer 32 is grown on substrate 30. Stop layer 32 is made of AlGaAs. In later processing steps, substrate 30 will be etched off; stop layer 32 prevents further etching into subsequent layers at that time. Stop layer 32 may have, for example, a thickness between approximately 1.0 and 1.5 $\mu$m and an aluminum composition of forty-five percent or greater. The aluminum composition is chosen to ensure that the selective etch used to remove substrate 32 will terminate at stop layer 32. Other materials could be used to form stop layer 32.

Active layer 18 is then epitaxially grown on top of stop layer 32. Active layer 18 in this example has a thickness of between 1.5 and 3.0 $\mu$m. As described above, active layer 18 comprises two or more sublayers. In this example, active layer 18 comprises first sublayer 20, second sublayer 22, and third sublayer 24, which are each 0.5 to 1.0 $\mu$m thick. Here, active layer 18 is InGaAs. Third sublayer 24 is first grown followed by second sublayer 22 and first sublayer 20. Each sublayer of active layer 18 is doped using a p-type impurity (such as Zn) at levels of between 1 and $9\times10^{18}$ $cm^{-3}$ to provide electron transportability through active layer 18 and reduction of the surface work function of active layer 18 for surface electron escapability. In this example, the doping of the sublayers ranges from low doping ($2\times10^{18}$ $cm^{-3}$) for first sublayer 20 to higher doping ($6\times10^{18}$ $cm^{-3}$) for a third sublayer 24. This doping construction allows for increased electron transport due to longer diffusion lengths. The indium concentration of each sublayer varies as discussed above.

Window layer 16 is then epitaxially grown on active layer 18. Window layer 16 in this embodiment is AlGaAs and is doped as described above.

Finally, cap layer 34 is epitaxially grown on top of window layer 16. Cap layer 34, for example, may be formed of gallium arsenide. Cap layer 34 serves to protect window layer 16 during the cool down of the full epitaxial structure and/or during wafer transport.

After wafer 28 is grown, cap layer 34 is removed with a proper selective etch to expose window layer 16. Coating layer 14, as illustrated in FIG. 1, is then applied to the exposed surface of window layer 16. Coating layer 14 itself comprises an anti-reflection layer and a thermal bonding layer as described above. After coating layer 14 has been applied to the surface of window layer 16, the full wafer structure is heated during a thermal compression bonding of the wafer structure to face plate 12.

After face plate 12 has been bonded to the wafer structure, substrate 30 and stop layer 32 are selectively etched to expose active layer 18. Using standard thin film techniques, electrode 26 is formed and coupled to face plate 12, active layer 18, window layer 16, and coating layer 14. In this embodiment, electrode 26 is applied to the circumference of each layer as illustrated in FIG. 1.

Photocathode 10 is then etched to remove residual gas, moisture, and oxides that have attached to the surface of active layer 18 during previous processing. Photocathode 10 is next placed into a vacuum system and heated to clean the surface of active layer 18. To activate active layer 18, cesium and oxygen vapor are evaporated onto its surface. During evaporation, input light enters the surface of active layer 18 producing an output current measured from electrode 26. Cesium and oxygen vapors are further applied until achieving a maximum electrode current. At this point, the evaporation process stops and photocathode 10 may then be sealed into an image intensifier tube such as that described below in connection with FIG. 3.

It should be understood that the invention is not limited to the illustrated structures and that a number of substitutions can be made without departing from the scope and teachings of the present invention. For example, electrode 26 is a chrome gold electrode. Chrome-gold was chosen for this embodiment because it aids in vacuum sealing of image intensifier tubes such as those discussed in connection with FIG. 3. Electrode 26 could be made of a different material.

Face plate 12 is formed from Corning 7056 glass. 7056 glass or its equivalent is advantageously used because its thermal expansion coefficient matches closely with the thermal expansion coefficient of the remainder of photocathode 10. Face plate 12 could be made of another material such as quartz or a fiberoptic material.

Anti-reflection coating 14 could be omitted in some applications. In addition, the various sublayers of anti-reflection coating 14 could be made of different materials and/or have different thicknesses.

Depending upon the material used for active layer 18, window layer 16 could be made of a different semiconductor material. A semiconductor material should preferably be chosen having a lattice constant close to that of first sublayer 20 of active layer 18. Here, window layer 16 is comprised of two group III–V semiconductor compounds—AlAs and GaAs. Other group III–V semiconductor compounds could be used and more than two such compounds could be used. Window layer 16 could also have a different thickness and/or a different doping.

The disclosed embodiment has three sublayers in active layer 18. Active layer 18 could have only two sublayers or more than three sublayers. Each of the sublayers of active layer 18 could be doped differently or have different thicknesses. Different group III–V semiconductor materials could also be used for active layer 18. Here, the group III–V semiconductor compounds InAs and GaAs have been used. Other group III–V semiconductor compounds could be used and more than two group III–V semiconductor compounds could be used to form active layer 18.

In this example, the sublayers of active layer 18 have an InAs concentration of five percent, ten percent, and fifteen percent. These percentages can be varied. For example, to produce a photocathode capable of detecting radiation produced by an erbium-doped glass laser (1.4–1.5 $\mu$m), one of the InGaAs sublayers should have an indium concentration of between fifty and sixty percent. The number of sublayers and concentration for each sublayer will vary depending upon the desired application.

Figure 3:
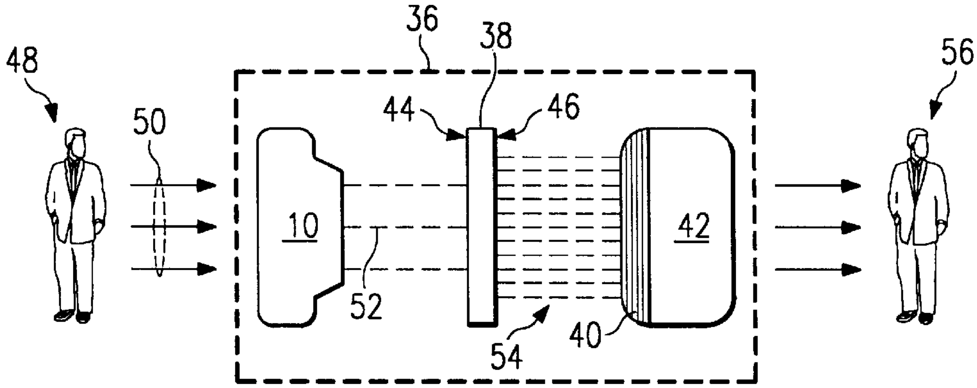
FIG. 3 illustrates an image intensifier tube made in accordance with the invention.

Photocathode 10 may advantageously be used for image intensifier tubes commonly used for night vision systems. FIG. 3 illustrates an image intensifier tube 36 made in accordance with the invention. Image intensifier tube 36 comprises photocathode 10 which is operable to emit electrons in response to photons emitted from an image. A display apparatus couples to photocathode 10 and is operable to transform the emitted electrons into a visible light image. In the embodiment illustrated in FIG. 3, the display apparatus comprises a multichannel plate 38 adjacent to photocathode 10, a phosphor screen 40 adjacent to multichannel plate 38 and a fiberoptic anode 42 adjacent to phosphor screen 40.

Multichannel plate 38 may comprise, for example, a thin wafer having several parallel hollow glass fibers, each oriented slightly off axis with respect to incoming electrons. In the embodiment of FIG. 3, multichannel plate 38 multiplies incoming electrons with a cascade of secondary electrons through the channels by applying a voltage across the two faces 44, 46 of multichannel plate 38. The surface of phosphor screen 40 receives electrons from multichannel plate 38 and phosphor screen 40 generates a visible light image. Fiberoptic anode 42 translates the image produced by phosphor screen 40 using, for example, fiberoptic bundles to form a translated image that is visible to an observer.

FIG. 3 further illustrates the operation of image intensifier tube 36. An image 48 emits photons 50 which are directed onto a surface of photocathode 10. Photocathode 10 transforms photons 50 into electrons 52 which gain energy from an electric field between photocathode 10 and multichannel plate 38. Multichannel plate 38 multiplies the incoming electrons 52 with a cascade of secondary electrons to form multiplied electrons 54 which are then transported by a high energy electric field between multichannel plate 38 and the surface of phosphor screen 40. As electrons strike phosphor screen 40, they generate a visible light image which is then translated by fiberoptic anode into an output image 56 visible to an observer.

Figure 4:
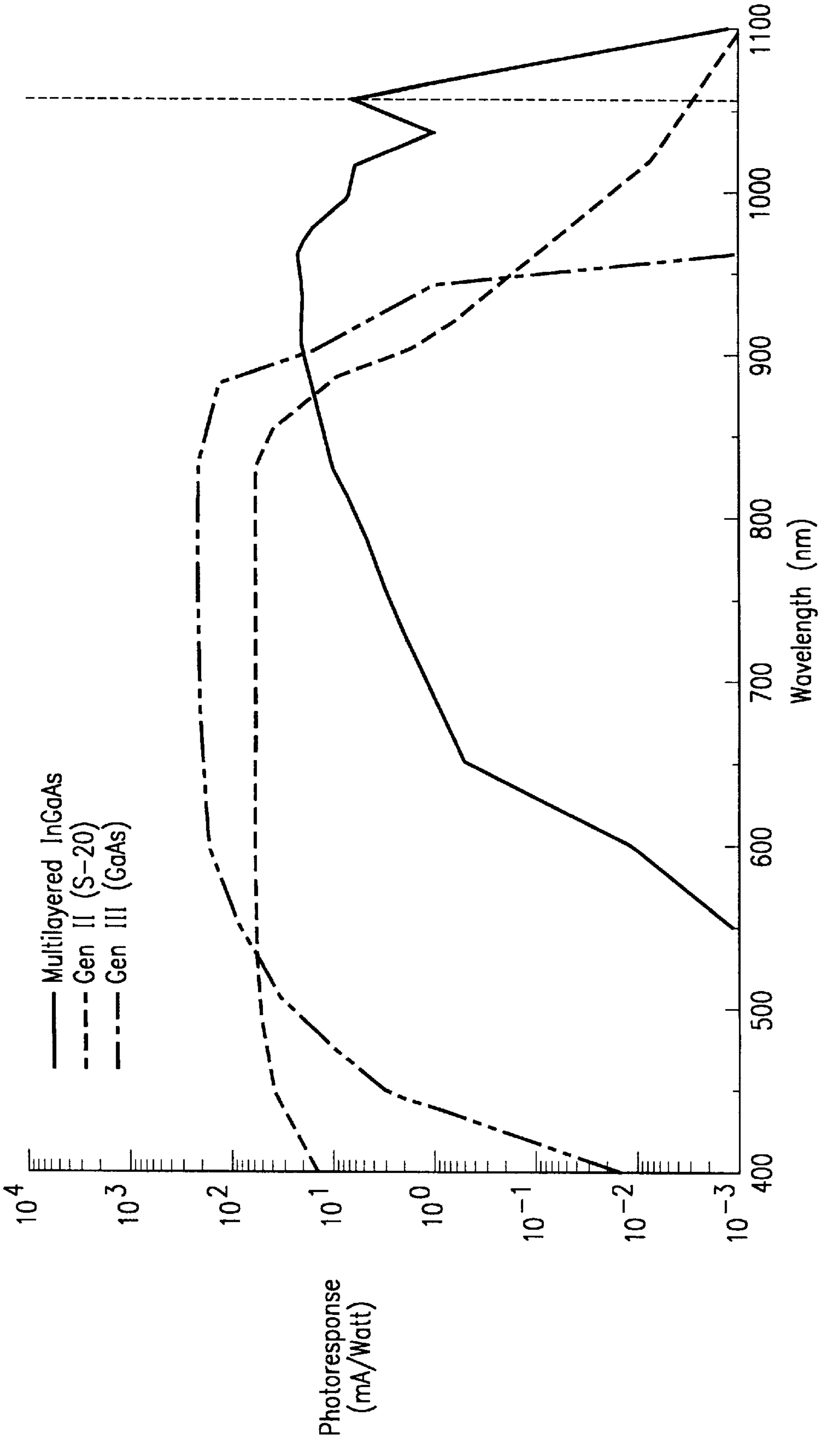
FIG. 4 is a graph comparing the spectral response of conventional Gen II and Gen III image intensifier tubes with an example image intensifier tube constructed in accordance with the teachings of the present invention.

FIG. 4 illustrates a graph comparing the spectral response of standard Gen II and Gen III image intensifier tubes with an image intensifier tube 36 constructed in accordance with the teachings of the present invention. The embodiment of photocathode 10 illustrated in FIG. 1 was used for the image intensifier tube 36. This embodiment has high sensitivity at the 1.06 $\mu$m wavelength. This embodiment is thus useful for applications where imaging of an Nd:YAG laser is, desired. This graph provides only one example of the spectral responses that can be achieved when using image intensifier tubes constructed using the techniques of the invention.

Although the present invention and its advantages have been described in detail, it should be understood that various changes, substitutions and alterations can be made therein without departing from the spirit and scope of the invention as defined by the appended claims.

What is claimed is:

1. An image intensifier tube for creating a visible light image from an image that is emitting photons, comprising:

a photocathode comprising an active layer, the active layer comprising at least two sublayers, each operable to emit electrons in response to absorption of the photons, the at least two sublayers comprising a first sublayer and a second sublayer, the first sublayer further having a first group III–V semiconductor compound, the first group III–V semiconductor compound having a group V element and a first concentration of a group III element, the second sublayer further having a second group III–V semiconductor compound, the second group III–V semiconductor compound having the group V element and a second concentration of the group III element, the second concentration being different from the first concentration wherein the photocathode is operable to emit electrons in response to the photons, and wherein the active layer is operable to cause emission of substantially all of the electrons emitted by the photocathode in response to absorption of the photons within the active layer;

a display apparatus coupled to the photocathode and operable to transform the emitted electrons into a visible light image.

2. The image intensifier tube of claim 1 wherein the display apparatus comprises:

a multichannel plate adjacent to the photocathode and operable to multiply the electrons to form multiplied electrons;

a phosphor screen operable to receive the multiplied electrons and generate a visible light image therefrom; and a fiber optic anode to translate the visible light image.

3. The image intensifier tube of claim 1 wherein the first concentration is less than the second concentration.

4. The image intensifier tube of claim 3 wherein the active layer further comprises:

a third sublayer having a third group III–V semiconductor compound, the third group III–V semiconductor compound having a third concentration of the group III element.

5. The image intensifier tube of claim 4 wherein the second concentration is less than the third concentration.

6. The image intensifier tube of claim 5, the photocathode further comprising:

a window layer adjacent to the first sublayer.

7. The image intensifier tube of claim 1 wherein the first group III–V semiconductor compound comprises indium-gallium-arsenide.

8. The image intensifier tube of claim 7 wherein the first sublayer has an indium-arsenide concentration that is less than the indium-arsenide concentration of the second sublayer.

9. The image intensifier tube of claim 8 wherein the first sublayer has an indium-arsenide concentration between zero and ten percent.

10. The image intensifier tube of claim 9 wherein the second sublayer has an indium-arsenide concentration between five and twenty percent.

11. The image intensifier tube of claim 10 wherein the photocathode further comprises:

a window layer adjacent to the first sublayer.

12. The image intensifier tube of claim 11 wherein the photocathode further comprises:

a third sublayer adjacent to the second sublayer having an indium-arsenide concentration of approximately fifteen percent; and wherein the first sublayer has a indium-arsenide concentration of approximately five percent and the second sublayer has an indium-arsenide concentration of approximately ten percent.

13. A photocathode, comprising:

a window layer; and an active layer coupled to the window layer, the active layer operable to cause emission of substantially all of the electrons emitted by the photocathode in response to absorption of photons incident to the active layer, wherein the active layer further comprises at least two sublayers, each operable to emit electrons in response to absorption of the photons, the at least two sublayers comprising a first and a second sublayer, the first sublayer further having a first group III–V semiconductor compound, the first group III–V semiconductor compound having a group V element and a first concentration of a group III element, the second sublayer further having a second group III–V semiconductor compound, the second group III–V semiconductor compound having the group V element and a second concentration of the group III element, the second concentration being different from the first concentration.

14. The photocathode of claim 13 wherein the first sublayer is adjacent to the window layer, and wherein the first concentration is less than the second concentration.

15. The photocathode of claim 14 wherein the active layer further comprises:

a third sublayer having a third group III–V semiconductor compound, the third group III–V semiconductor compound having a third concentration of the group III element.

16. The photocathode of claim 15 wherein the second concentration is less than the third concentration.

17. The photocathode of claim 13 wherein the active layer further comprises indium-gallium-arsenide.

18. The photocathode of claim 13, wherein the group III element comprises indium.

19. The photocathode of claim 13, wherein each one of the group III–V semiconductor compounds comprises indium-gallium-arsenide.

20. The image intensifier tube of claim 6, wherein the second sublayer is positioned between the first sublayer and the third sublayer.

* * * * *